(12) United States Patent
Yamanaka

(10) Patent No.: US 11,878,387 B2
(45) Date of Patent: Jan. 23, 2024

(54) AS-SLICED WAFER PROCESSING METHOD

(71) Applicant: DISCO CORPORATION, Tokyo (JP)

(72) Inventor: Satoshi Yamanaka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 105 days.

(21) Appl. No.: 17/408,664

(22) Filed: Aug. 23, 2021

(65) Prior Publication Data

US 2022/0072680 A1    Mar. 10, 2022

(30) Foreign Application Priority Data

Sep. 7, 2020  (JP) ................................ 2020-149649

(51) Int. Cl.
*B24B 37/04*    (2012.01)
*H01L 21/02*    (2006.01)

(52) U.S. Cl.
CPC ...... *B24B 37/042* (2013.01); *H01L 21/02021* (2013.01)

(58) Field of Classification Search
CPC ..... B24B 37/042; B24B 37/10; B24B 37/105; B24B 9/06; B24B 9/065; B24B 7/228; H01L 21/02021; H01L 21/67092; H01L 21/683; H01L 21/6838; H01L 21/68785; H01L 21/68792; H01L 21/02013; H01L 21/02016

See application file for complete search history.

(56) References Cited

U.S. PATENT DOCUMENTS

| 2003/0171075 A1* | 9/2003 | Nihonmatsu ..... H01L 21/02008 451/41 |
| 2017/0095902 A1* | 4/2017 | Yoshida .................. B24B 7/228 |

FOREIGN PATENT DOCUMENTS

| JP | 08155948 A | | 6/1996 | |
| JP | 2010021394 A | * | 1/2010 | ............. B24B 9/065 |
| JP | 2019212761 A | * | 12/2019 | ............. B24B 9/065 |
| KR | 101399496 B1 | * | 5/2014 | ............... B24B 9/06 |
| KR | 101831487 B1 | * | 4/2018 | ............... B24B 9/08 |
| WO | WO0028583 A1 | * | 5/2000 | ............. B24B 7/228 |

OTHER PUBLICATIONS

English translation of KR101399496B1 (Year: 2014).*
English translation of KR101831487B1 (Year: 2018).*
English translation of WO0028583A1 (Year: 2000).*
English translation of JP2019212761A (Year: 2019).*
English translation of JP2010021394A (Year: 2010).*

* cited by examiner

*Primary Examiner* — Joel D Crandall
*Assistant Examiner* — Sukwoo James Chang
(74) *Attorney, Agent, or Firm* — GREER BURNS & CRAIN, LTD.

(57) ABSTRACT

An as-sliced wafer processing method includes a grinding step of grinding a first surface of an as-sliced wafer, an outer periphery positioning step of moving a chuck table and a grinding unit relative to each other in directions parallel to a holding surface of the chuck table so as to position an edge on an outer periphery of grinding stones at an outer peripheral edge of the first surface after the grinding step is carried out, and a chamfering step of chamfering an outer periphery of the first surface of the as-sliced wafer by the grinding stones after the outer periphery positioning step is carried out.

3 Claims, 5 Drawing Sheets

AS-SLICED WAFER PROCESSING METHOD

BACKGROUND OF THE INVENTION

Field of the Invention

The present invention relates to an as-sliced wafer processing method for processing an as-sliced wafer generated from a semiconductor ingot (hereinafter, simply referred to as an ingot).

Description of the Related Art

A wafer has a silicon (Si) substrate a face side of which is partitioned by a plurality of crossing division lines into a plurality of regions, and a plurality of devices such as integrated circuits (ICs) or large scale integration (LSI) circuits are formed in the respective regions. The wafer is divided into individual device chips by a dicing apparatus or a laser processing apparatus, and the divided device chips are used for electric appliances such as mobile phones and personal computers.

What is generally called an as-sliced wafer, on a face side of which devices are yet to be formed, is generated by being sliced from an ingot made of Si or the like as a piece having a thickness of approximately 1 mm by a cutting apparatus provided with an inner peripheral blade, a wire saw, or the like (see Japanese Patent Laid-open No. Hei 08-155948, for example). Both sides of the as-sliced wafer thus generated from the ingot are ground and, thereafter, chamfered at an outer peripheral edge thereof by using a dedicated processing tool, so that the wafer is processed into a state suitable for receiving devices to be formed on the face side thereof.

SUMMARY OF THE INVENTION

The as-sliced wafer processing method in the conventional technology has a disadvantage that the productivity is low since it is necessary to carry out grinding and then a plurality of steps such as chamfering by using a dedicated apparatus or dedicated processing tools before the wafer becomes ready for receiving devices to be formed on the face side thereof.

Therefore, it is an object of the present invention to provide an as-sliced wafer processing method for enabling efficient processing on an as-sliced wafer.

In accordance with an aspect of the present invention, there is provided an as-sliced wafer processing method for processing an as-sliced wafer generated from a semiconductor ingot. The as-sliced wafer processing method includes an as-sliced wafer holding step of holding an as-sliced wafer on a chuck table that has a holding surface for holding a workpiece thereon and is rotatable; a first grinding step of causing a grinding unit to approach the chuck table, the grinding unit having a rotatable grinding wheel that faces the holding surface and has a plurality of grinding stones arranged thereon in an annular manner, and rotating the grinding wheel such that the grinding stones pass through a rotation center of the as-sliced wafer held on the chuck table, to thereby grind a first surface of the as-sliced wafer; a first outer periphery positioning step of moving the chuck table and the grinding unit relative to each other in directions parallel to the holding surface so as to position an edge on an outer periphery of the grinding stones at an outer peripheral edge of the first surface after the first grinding step is carried out; and a first chamfering step of chamfering an outer periphery of the first surface of the as-sliced wafer by the grinding stones after the first outer periphery positioning step is carried out. The first chamfering step positions the edge on the outer periphery of the grinding stones at the outer peripheral edge of the first surface of the as-sliced wafer and, while causing the grinding stones to approach the chuck table, moves the grinding stones in a direction toward the outer periphery of the first surface of the as-sliced wafer, to thereby grind the outer peripheral edge of the first surface to form a chamfered portion on the first surface.

Preferably, the as-sliced wafer processing method further includes a second grinding step of holding the as-sliced wafer on the chuck table such that the ground first surface faces downward and a second surface opposing the first surface faces upward, and rotating the grinding wheel such that the grinding stones pass through a rotation center of the as-sliced wafer held on the chuck table, to thereby grind the second surface of the as-sliced wafer; a second outer periphery positioning step of moving the chuck table and the grinding unit relative to each other in directions parallel to the holding surface so as to position the edge on the outer periphery of the grinding stones at an outer peripheral edge of the second surface of the as-sliced wafer after the second grinding step is carried out; and a second chamfering step of chamfering an outer periphery of the second surface of the as-sliced wafer by the grinding stones after the second outer periphery positioning step is carried out. The second chamfering step positions the edge on the outer periphery of the grinding stones at the outer peripheral edge of the second surface of the as-sliced wafer and, while causing the grinding stones to approach the chuck table, moves the grinding stones in a direction toward the outer periphery of the second surface of the as-sliced wafer, to thereby grind the outer peripheral edge of the second surface to form a chamfered portion on the second surface.

According to the present invention, a series of steps including a grinding step of grinding a face side or a reverse side of an as-sliced wafer and a chamfering step of chamfering an outer periphery of the face side or the reverse side can be carried out without changing a processing apparatus and processing tools, contributing to enhancement in productivity.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
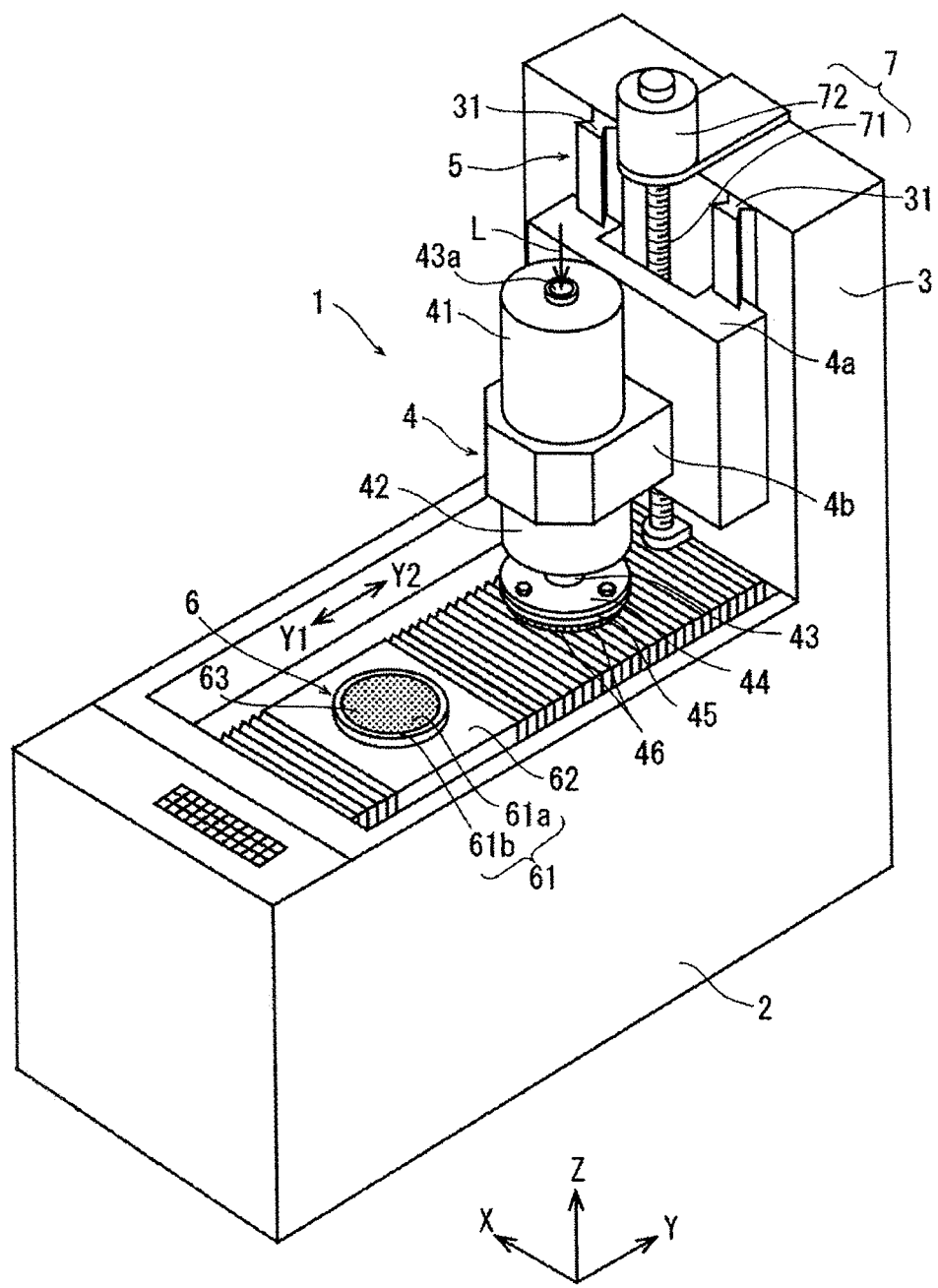
FIG. 1 is a perspective view illustrating the whole of a grinding apparatus with which the processing method according to an embodiment of the present invention can be carried out.

An as-sliced wafer processing method according to an embodiment of the present invention is hereinafter described in detail with reference to the attached drawings. FIG. 1 is a perspective view illustrating the whole of a grinding apparatus 1 that is suitable for carrying out the as-sliced wafer processing method according to the present embodiment. The grinding apparatus 1 illustrated in FIG. 1 includes an apparatus housing 2 substantially shaped as a rectangular parallelepiped, an upright wall 3 standing at a rear end portion of the apparatus housing 2, a grinding unit 4 for grinding a workpiece, and a chuck table mechanism 6 for holding the workpiece.

The chuck table mechanism 6 includes a chuck table 61 and a cover plate 62. The chuck table 61 has a suction chuck 61a in the form of a circular disk as illustrated and a frame body 61b surrounding the suction chuck 61a and is configured to be rotated by a rotational drive source not illustrated. The cover plate 62 covers an area surrounding the chuck table 61 and allows the chuck table 61 to protrude upward therethrough. The suction chuck 61a is formed of a porous member having air permeability and is connected to a suction source not illustrated. When the suction source is actuated, a negative pressure is supplied to a holding surface 63 of the suction chuck 61a to thereby hold a workpiece placed on the holding surface 63 under suction.

The apparatus housing 2 accommodates a moving mechanism (illustration omitted) that moves the chuck table mechanism 6 in directions indicated as Y-axis directions in the figure. By operating the moving mechanism, the chuck table mechanism 6 can be moved between a loading/unloading area on a front side in the figure (direction indicated by an arrow Y1) where an unprocessed workpiece is placed on the chuck table 61 and a processing area on a depth side in the figure (direction indicated by an arrow Y2) where the grinding unit 4 grinds a workpiece held on the chuck table 61.

The grinding unit 4 is disposed on a front surface of the upright wall 3. The grinding unit 4 is mounted to a moving base 4a, and the moving base 4a is engaged, on a rear surface side thereof, with a pair of guide rails 31 disposed on the upright wall 3 of the apparatus housing 2 such that the moving base 4a is mounted slidably with respect to the guide rails 31 in Z-axis directions (vertical directions) in the figure.

The grinding unit 4 includes a spindle housing 42 supported by a supporting portion 4b integrally formed with the moving base 4a, a spindle 43 rotatably held by the spindle housing 42, and an electric motor 41 disposed as means for rotationally driving the spindle 43. A lower end portion of the spindle 43 protrudes downward from a lower end of the spindle housing 42, and a wheel mount 44 is disposed at the lower end portion of the spindle 43. A grinding wheel 45 is mounted to a lower surface of the wheel mount 44, and a plurality of grinding stones 46 are annularly arranged on a lower surface of the grinding wheel 45 such that the grinding stones 46 face the holding surface 63 of the chuck table 61 when the chuck table 61 is positioned in the processing area directly below the grinding wheel 45. A grinding water L supplied from grinding water supplying means (illustration omitted) is introduced from an upper end portion 43a of the spindle 43, flows through a passage running inside the spindle 43, and is supplied to the processing area from a central portion of the lower surface of the grinding wheel 45.

The grinding apparatus 1 illustrated in FIG. 1 includes a grind-feeding mechanism 7 that moves the grinding unit 4 in the Z-axis directions (directions perpendicular to the holding surface 63 of the chuck table 61) along the pair of guide rails 31. The grind-feeding mechanism 7 includes an externally threaded rod 71 disposed on the front surface side of the upright wall 3 and extending in the vertical directions, and a pulse motor 72 as a drive source for rotationally driving the externally threaded rod 71. The externally threaded rod 71 is rotatably supported at an upper end portion and a lower end portion thereof by the upright wall 3, and an output shaft of the pulse motor 72 is coupled to an upper end portion of the externally threaded rod 71. A screw joint section (illustration omitted) is formed on the rear surface of the moving base 4a and has an internally threaded hole formed to extend in the vertical directions. The externally threaded rod 71 is screwed into the internally threaded hole. The grind-feeding mechanism 7 including such a screw mechanism can make a normal rotation of the pulse motor 72 to lower the grinding unit 4 together with the moving base 4a and make a reverse rotation of the pulse motor 72 to raise the grinding unit 4 together with the moving base 4a.

The grinding apparatus 1 includes a control unit (illustration omitted) to which the grinding unit 4, the grind-feeding mechanism 7, the moving mechanism (illustration omitted), and the like are connected, and the control unit precisely controls the unit and mechanisms on the basis of a desired control program.

The grinding apparatus 1 illustrated in FIG. 1 is configured substantially as described above, and the as-sliced wafer processing method according to the present embodiment, which is carried out by using the grinding apparatus 1, is hereinafter described.

Figure 2:
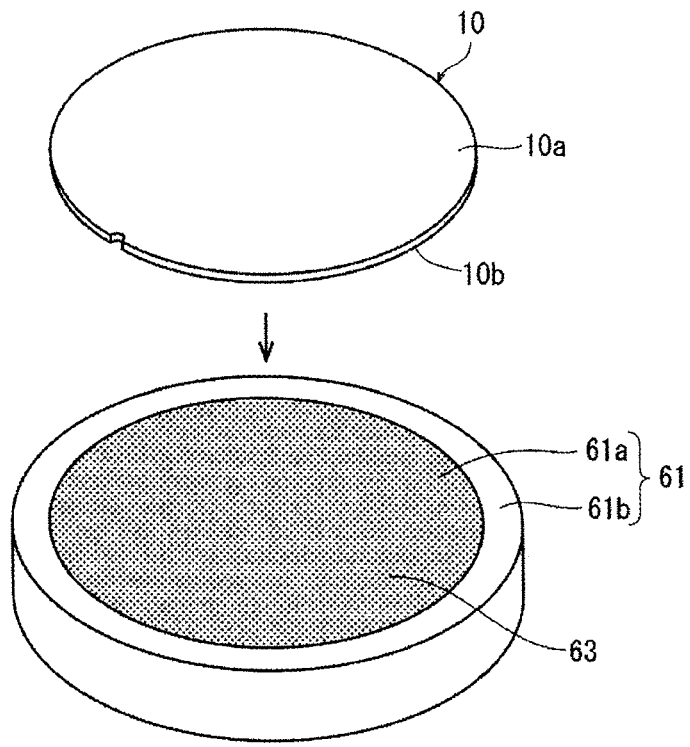
FIG. 2 is a perspective view for describing an as-sliced wafer holding step according to the embodiment.

FIG. 2 illustrates an as-sliced wafer 10 made of Si as a workpiece in the present embodiment. The as-sliced wafer 10 is, for example, a wafer that is in the form of a circular disk having a diameter of approximately 100 mm, is formed by slicing off a piece having a thickness of approximately 1 mm from a columnar single crystal ingot (illustration omitted), and has no device formed on a face side and a reverse side thereof. In the present specification and the claims, such a wafer is defined as an as-sliced wafer.

When the as-sliced wafer processing method according to the present embodiment is to be carried out, the as-sliced wafer 10 is placed and held on the holding surface 63 of the chuck table 61 positioned in the loading/unloading area such that a first surface 10a of the as-sliced wafer 10 faces upward and a second surface 10b of the as-sliced wafer 10 faces downward as illustrated in FIG. 2 (as-sliced wafer holding step). In this instance, the as-sliced wafer 10 is placed such that the center thereof coincides with the center of the chuck table 61. By actuating a suction source (illustration omitted) to supply a negative pressure to the holding surface 63 of the chuck table 61, the as-sliced wafer 10 is held under suction on the holding surface 63. It is to be noted that, while the as-sliced wafer 10 in the present embodiment has not been subjected to any processing on the face side and the reverse side thereof after being cut out from the ingot and has no distinction between the face side and the reverse side thereof, the side to be processed first will be referred to as a "first surface" and the opposite side will be referred to as a "second surface," for the convenience of explanation.

Figure 3:
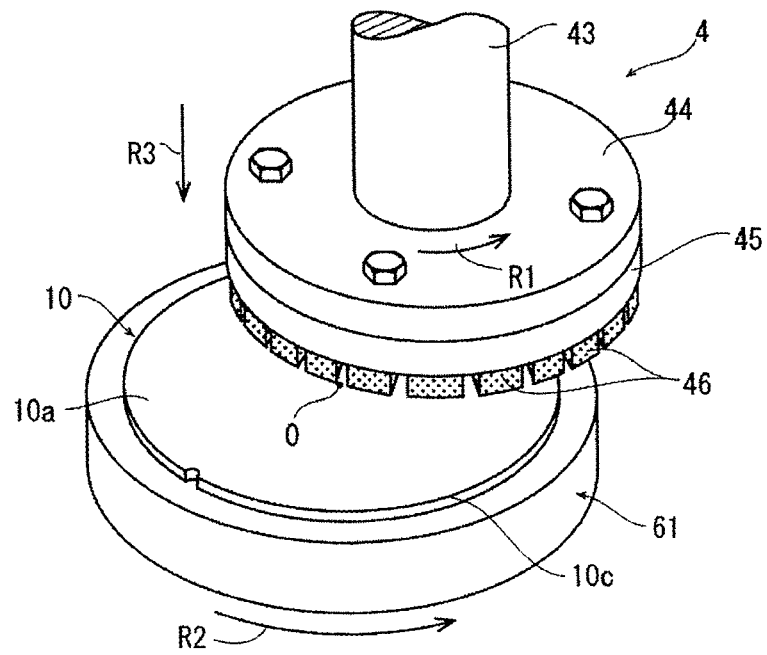
FIG. 3 is a perspective view for describing a first grinding step according to the embodiment.

After carrying out the as-sliced wafer holding step described above, the moving mechanism is operated to move the chuck table 61 in the direction indicated by the arrow Y2 in FIG. 1 to the processing area. The grind-feeding mechanism 7 is then operated to cause the grinding unit 4 to approach the chuck table 61, to thereby position the grinding wheel 45 such that the grinding stones 46 pass through a rotation center O of the as-sliced wafer 10 held on the chuck table 61 as illustrated in FIG. 3. The electric motor 41 of the grinding unit 4 is then actuated to rotate the grinding wheel 45 in a direction indicated by an arrow R1 at 6000 rpm, for example, while the chuck table 61 is rotated in a direction indicated by an arrow R2 at 300 rpm, for example. In addition, at the same time, the grind-feeding mechanism 7 is operated to lower the grinding unit 4 in a direction indicated by an arrow R3 at a lowering speed of 1.0 μm/sec, for example, until the grinding stones 46 are brought into contact with the first surface 10a of the as-sliced wafer 10, thereby grinding the first surface 10a of the as-sliced wafer 10 by a predetermined amount (first grinding step). It is to be noted that the first grinding step is preferably carried out while detecting the amount to be ground by using thickness detecting means (illustration omitted).

Figure 4A:
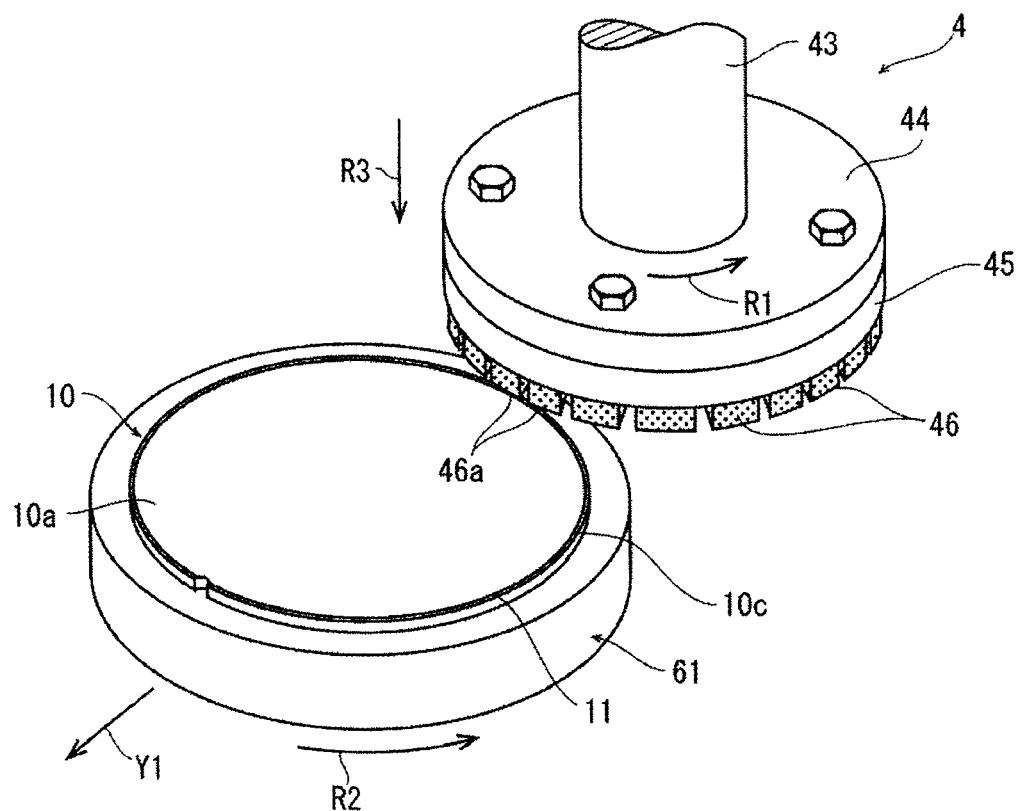
FIG. 4A is a perspective view for describing a first chamfering step according to the embodiment.

After carrying out the first grinding step described above, the chuck table 61 and the grinding unit 4 are moved relative to each other in directions parallel to the holding surface 63 of the chuck table 61 as illustrated in FIG. 4A (in the present embodiment, the chuck table 61 is moved in the direction indicated by the arrow Y1), and an edge 46a of the grinding stones 46 is positioned at an outer peripheral edge 10c of the first surface 10a (first outer periphery positioning step).

Figure 4B:
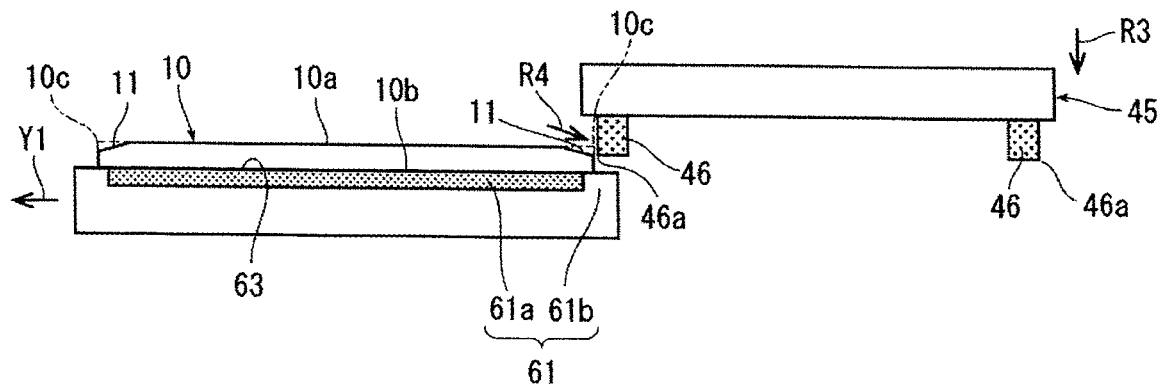
FIG. 4B is a schematic sectional view obtained during the first chamfering step described with reference to FIG. 4A.

After carrying out the first outer periphery positioning step, a first chamfering step is carried out in which the grinding stones 46 chamfer the outer peripheral edge 10c of the first surface 10a of the as-sliced wafer 10. In the first chamfering step, the edge 46a of the grinding stones 46 is first positioned at the outer peripheral edge 10c of the first surface 10a of the as-sliced wafer 10, and the grinding stones 46 are lowered in the direction indicated by the arrow R3 to approach the chuck table 61 while moving the chuck table 61 in the direction indicated by the arrow Y1. In this manner, the grinding stones 46 are moved toward an outer periphery of the first surface 10a of the as-sliced wafer 10, that is, moved in a direction indicated by an arrow R4 in FIG. 4B. As a result, the outer peripheral edge 10c of the as-sliced wafer 10 is ground to form a chamfered portion 11 at the outer peripheral edge 10c of the first surface 10a. The first chamfering step is then completed. It is to be noted that the first chamfering step in the present embodiment is carried out continuously from the first grinding step described above while the rotation of the grinding wheel 45 of the grinding unit 4 and the rotation of the chuck table 61 started in the first grinding step are kept. However, the present invention is not limited to this example, and the rotation of the grinding wheel 45 and the rotation of the chuck table 61 may be stopped once at the time of transition from the first grinding step to the first chamfering step. Further, while the chamfered portion 11 is formed linearly in the present embodiment such that the cross section of the as-sliced wafer 10 has a tapered shape as illustrated in FIG. 4B, it is also possible to form the chamfered portion 11 so as to have a curved cross section by adjusting the lowering speed of the grinding stones 46 and the speed of moving the chuck table 61 in the direction indicated by the arrow Y1 in the first chamfering step.

With the as-sliced wafer processing method described above, a series of steps including the first grinding step of grinding the first surface 10a of the as-sliced wafer 10 and the first chamfering step of chamfering the outer peripheral edge 10c of the first surface 10a can be carried out without changing the processing apparatus and the processing tools, contributing to enhancement in productivity.

With the as-sliced wafer processing method according to the present embodiment, a second grinding step and a second chamfering step to be described later can further be carried out after the first grinding step and the first chamfering step are carried out.

After carrying out the first grinding step and the first chamfering step described above, the moving mechanism is operated to move the chuck table 61 to the loading/unloading area, and the operation of the suction source is stopped. The as-sliced wafer 10 is unloaded from the chuck table 61, turned upside down, and placed on the holding surface 63 of the chuck table 61 such that the second surface 10b faces upward and the first surface 10a faces downward and that the center of the chuck table 61 coincides with the center of the as-sliced wafer 10. The suction source is then actuated to hold the as-sliced wafer 10 on the chuck table 61 under suction. (The step described in this paragraph is similar to the as-sliced wafer holding step described above with reference to FIG. 2, except that the as-sliced wafer 10 is turned upside down.)

Figure 5:
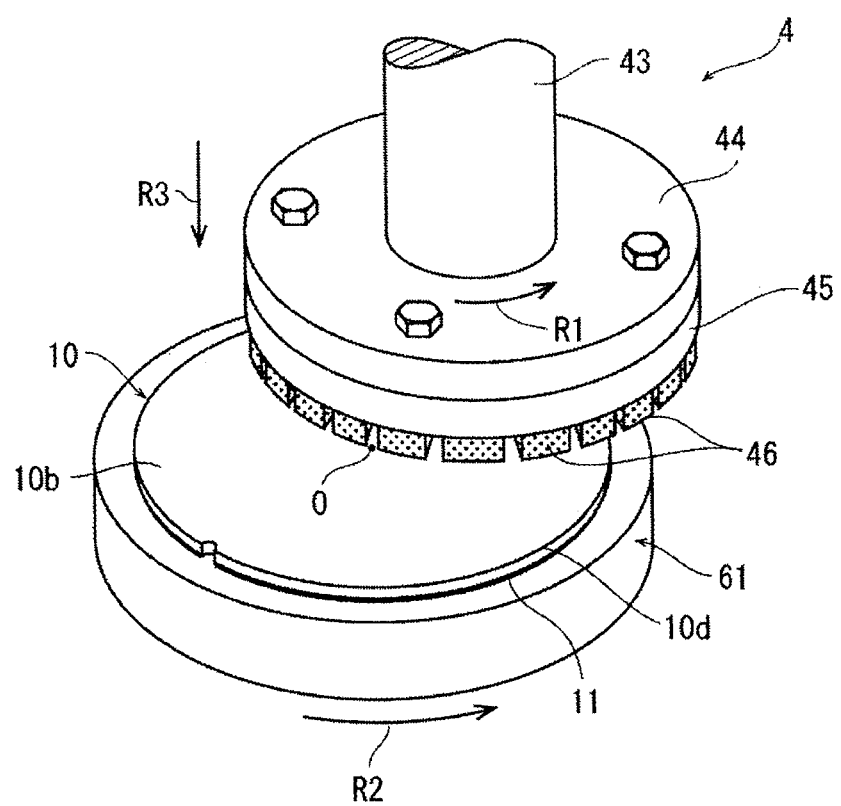
FIG. 5 is a perspective view for describing a second grinding step according to the embodiment.

Thereafter, the moving mechanism is operated to move the chuck table 61 in the direction indicated by the arrow Y2 in FIG. 1 to the processing area, and the grind-feeding mechanism 7 is operated to cause the grinding unit 4 to approach the chuck table 61, to thereby position the grinding wheel 45 such that the grinding stones 46 pass through the rotation center O of the as-sliced wafer 10 held on the chuck table 61 as illustrated in FIG. 5. The electric motor 41 of the grinding unit 4 is then actuated to rotate the grinding wheel 45 in the direction indicated by the arrow R1 at 6000 rpm, for example, while the chuck table 61 is rotated in the direction indicated by the arrow R2 at 300 rpm, for example. In addition, at the same time, the grind-feeding mechanism 7 is operated to lower the grinding unit 4 in the direction indicated by the arrow R3 at a lowering speed of 1.0 μm/sec, for example, until the grinding stones 46 are brought into contact with the second surface 10b of the as-sliced wafer 10, thereby grinding the second surface 10b of the as-sliced wafer 10 by a predetermined amount (second grinding step).

Figure 6A:
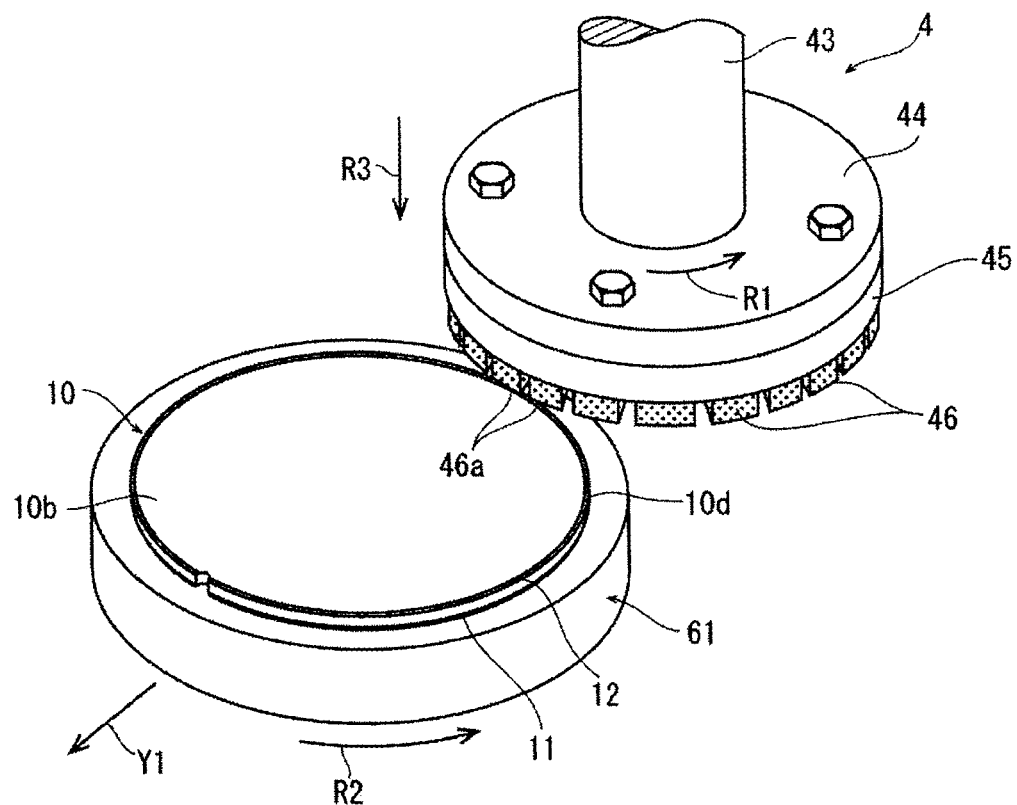
FIG. 6A is a perspective view for describing a second chamfering step according to the embodiment.

After carrying out the second grinding step described above, the chuck table 61 and the grinding unit 4 are moved relative to each other in the directions parallel to the holding surface 63 of the chuck table 61 as illustrated in FIG. 6A (in the present embodiment, the chuck table 61 is moved in the direction indicated by the arrow Y1), and the edge 46a of the grinding stones 46 is positioned at an outer peripheral edge 10d of the second surface 10b of the as-sliced wafer 10 (second outer periphery positioning step).

Figure 6B:
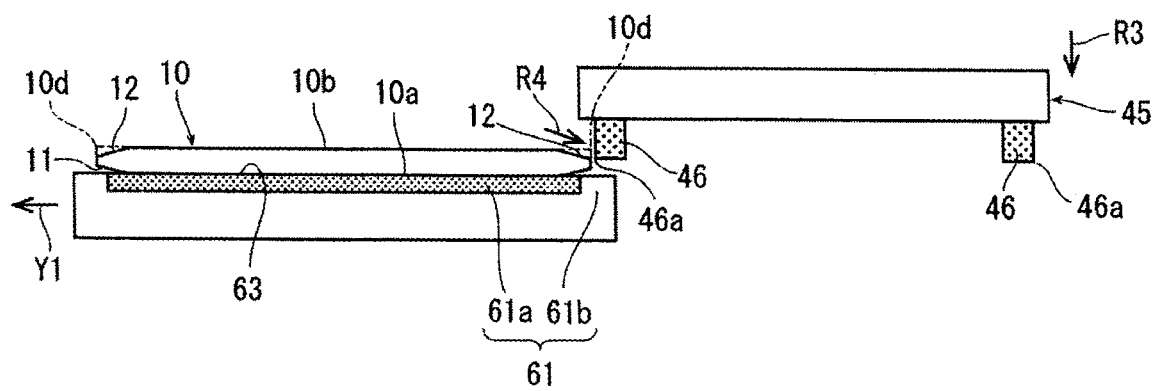
FIG. 6B is a schematic sectional view obtained during the second chamfering step described with reference to FIG. 6A.

After carrying out the second outer periphery positioning step, a second chamfering step is carried out in which the grinding stones 46 chamfer the outer peripheral edge 10d of the second surface 10b of the as-sliced wafer 10. In the second chamfering step, the edge 46a on an outer periphery side of the grinding stones 46 is first positioned at the outer peripheral edge 10d of the second surface 10b of the as-sliced wafer 10, and the grinding stones 46 are lowered in the direction indicated by the arrow R3 to approach the chuck table 61 while moving the chuck table 61 in the direction indicated by the arrow Y1. In this manner, the grinding stones 46 are moved toward an outer periphery of the second surface 10b of the as-sliced wafer 10, that is, moved in the direction indicated by the arrow R4 in FIG. 6B. As a result, the outer peripheral edge 10d of the second surface 10b is ground to form a chamfered portion 12 at the outer peripheral edge 10d. The second chamfering step is then completed. It is to be noted that the second chamfering step in the present embodiment is carried out continuously from the second grinding step, as with the first grinding step and the first chamfering step described above, while the rotation of the grinding wheel 45 of the grinding unit 4 and the rotation of the chuck table 61 started in the second grinding step are kept. Further, as with the chamfered portion 11 described above, the chamfered portion 12 formed in the present embodiment can be formed so as to have a curved cross section.

With the second grinding step and the second chamfering step described above, a series of steps including the second grinding step of grinding the second surface 10b of the as-sliced wafer 10 and the second chamfering step of chamfering the outer peripheral edge 10d of the second surface 10b can be carried out without changing the processing apparatus and the processing tools, contributing to enhancement in productivity.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An as-sliced wafer processing method for processing an as-sliced wafer generated from a semiconductor ingot, comprising:
   an as-sliced wafer holding step of holding an as-sliced wafer on a chuck table that has a holding surface for holding a workpiece thereon and is rotatable;
   a first grinding step of causing a grinding unit to approach the chuck table, the grinding unit having a rotatable grinding wheel that rotates about an axis extending in a first direction and that faces the holding surface and has a plurality of grinding stones arranged thereon in an annular manner, and rotating the grinding wheel such that the grinding stones pass through a rotation center of the as-sliced wafer held on the chuck table, to thereby grind a first surface of the as-sliced wafer;
   a first outer periphery positioning step of moving the chuck table and the grinding unit relative to each other in directions parallel to the holding surface so as to position an edge on an outer periphery of the grinding stones at an outer peripheral edge of the first surface after the first grinding step is carried out; and
   a first chamfering step of chamfering an outer periphery of the first surface of the as-sliced wafer by the grinding stones after the first outer periphery positioning step is carried out,
   wherein the first chamfering step positions the edge on the outer periphery of the grinding stones at the outer peripheral edge of the first surface of the as-sliced wafer and, while causing the grinding stones to approach the chuck table in the first direction, simultaneously moves the grinding stones, with respect to the wafer, in a second direction toward the outer periphery of the first surface of the as-sliced wafer, to thereby grind the outer peripheral edge of the first surface to form a chamfered portion on the first surface, wherein the first direction is perpendicular to the second direction.

2. The as-sliced wafer processing method according to claim 1, further comprising:
   a second grinding step of holding the as-sliced wafer on the chuck table such that the ground first surface faces downward and a second surface opposing the first surface faces upward, and rotating the grinding wheel such that the grinding stones pass through a rotation center of the as-sliced wafer held on the chuck table, to thereby grind the second surface of the as-sliced wafer;
   a second outer periphery positioning step of moving the chuck table and the grinding unit relative to each other in directions parallel to the holding surface so as to position the edge on the outer periphery of the grinding stones at an outer peripheral edge of the second surface of the as-sliced wafer after the second grinding step is carried out; and
   a second chamfering step of chamfering an outer periphery of the second surface of the as-sliced wafer by the grinding stones after the second outer periphery positioning step is carried out,
   wherein the second chamfering step positions the edge on the outer periphery of the grinding stones at the outer peripheral edge of the second surface of the as-sliced wafer and, while causing the grinding stones to approach the chuck table, moves the grinding stones in a direction toward the outer periphery of the second surface of the as-sliced wafer, to thereby grind the outer peripheral edge of the second surface to form a chamfered portion on the second surface.

3. The as-sliced wafer processing method according to claim 1, wherein:
   the causing the grinding stones to approach the chuck table in the first direction comprises moving the rotatable grinding wheel vertically towards the chuck table; and
   the moving the grinding stones in the second direction towards the outer periphery of the as-sliced wafer comprises moving the chuck table horizontally.

* * * * *